United States Patent [19]

Mansfield et al.

[11] Patent Number: 5,162,736
[45] Date of Patent: Nov. 10, 1992

[54] NMR IMAGING

[75] Inventors: Peter Mansfield; Alistair Howseman; Roger J. Ordidge; David N. Guilfoyle, all of Nottingham, England

[73] Assignee: National Research Development Corporation, London, England

[21] Appl. No.: 642,921

[22] Filed: Jan. 18, 1991

Related U.S. Application Data

[63] Continuation of Ser. No. 437,028, Nov. 15, 1989, which is a continuation of Ser. No. 232,240, Aug. 15, 1988, abandoned.

[30] Foreign Application Priority Data

Aug. 14, 1987 [GB] United Kingdom ................ 8719244

[51] Int. Cl.[5] ........................................ G01R 33/20
[52] U.S. Cl. ................................................ 324/309
[58] Field of Search ............... 324/300, 309, 307, 311, 324/312, 318, 322

[56] References Cited

U.S. PATENT DOCUMENTS

| | | | |
|---|---|---|---|
| 4,110,681 | 8/1978 | Hofer | 324/313 |
| 4,509,015 | 4/1985 | Ordidge | 324/309 |
| 4,590,427 | 5/1986 | Fukushima | 324/318 |
| 4,743,851 | 5/1988 | Lim et al. | 324/309 |
| 4,769,991 | 8/1988 | Rzedzian | 324/312 |

Primary Examiner—Michael J. Tokar
Attorney, Agent, or Firm—Cushman, Darby & Cushman

[57] ABSTRACT

A nuclear magnetic resonance (NMR) method of producing a series of three or four dimensional spin parameter maps of a defined region, which spin parameter maps are displayable as a set of contiguous planar spin parameter maps with arbitrary orientation.

22 Claims, 7 Drawing Sheets

NMR IMAGING

This is a continuation of application Ser. No. 07/437,028, filed Nov. 15, 1989, which is a continuation of 07/232,240 filed Aug. 15, 1988 now abandoned.

The present invention relates to NMR (Nuclear Magnetic Resonance) imaging and more particularly to the production of a series of images to study changing phenomena.

Ultra-high speed echo-planar imaging (EPI) (P. Mansfield, J. Physics C10 L55 (1977); P. Mansfield and P. G. Morris, NMR Imaging in Biomedicine Academic Press New York (1982) is now used routinely for clinical studies in both children and adults, (A. Chrispin et al., Ped. Radiol. 16, 289–292 1986 a and b; M. Doyle et al. Lancet 11 682 1986; C. O'Callaghan et al., Arch. Dis. Childhood 63 186–189, 1988. In EPI snap-shot images are obtained from a single selectively excited slice in times ranging from 32 msec. to 64 msec. depending on the particular variant used, (B. Chapman et al. Mag. Res. Med. 1987). These relatively short data acquisition times mean that the echo-planar process can be rapidly repeated to produce a real-time movie sequence with immediate visual display of the image.

In terms of imaging time EPI represents a great stride forward, obviating patient motional blurring artifacts which are present in images produced by slower methods. The spatial resolution achievable is also likely to improve by using zonally magnified EPI (9) (P. Mansfield, R. J. Ordidge and R. Coxon, J. Phys. E. 21 275–80 1988).

Despite the obvious advantages of EPI, there are particular problems in cardiac imaging. The heart moves in three dimensions not two and EPI being a two dimensional technique, is unable to follow object motions in and out of the imaging plane. This problem of motion along the third axis is exacerbated by respiratory motion. Of course third axis motion may be mitigated by respiratory gating or by a breath hold. However, for a full three dimensional study of the thorax we find it difficult to obtain perfect contiguous matching of adjacent image planes. The problem of exact matching of adjacent planes will be important when looking for the coronary vessels, the ultimate objective of much of the current research in cardiac imaging by NMR.

The above referenced original EPI paper (Mansfield, J. Phys. C10 L55, 1977) did in fact address the problem of rapid three dimensional imaging from a general standpoint. There, a non-selective pulse is used to uniformly excite the whole of the object volume considered to be contained wholly within and enclosed by the R. F. coil assembly. However, the two dimensional case, given as an example, is the one which has been developed practically and uses single thin slice excitation.

It is an object of the present invention to provide a method of obtaining (a) volumar images or three dimensional spin density maps from an extended object, only part of which is contained within the R. F. coil assembly, (b) zonally localised volumar images or spin density maps of for example the heart, thereby accommodating the natural movement of the heart in time, and (c) three or four dimensional data arrays or spin parameter maps of which one dimension is chemical shift.

The present invention therefore provides a method of producing a series of three or four dimensional spin parameter maps of a defined region, which spin parameter maps are displayable as a set of contiguous planar spin parameter maps with arbitrary orientation, the means for producing each spin parameter map comprising a) a static magnetic field;
b) selective shaped RF pulses for regional localised spin excitation;
c) non-selective RF pulses;
d) a plurality of first linear magnetic field gradients at least one of which is modulated in a predetermined manner and all of which are switched in a controlled manner;
e) means for detecting the nuclear magnetic resonance signal produced;
f) means for sampling and digitising the NMR signal;
g) means for processing the sampled and digitised signals;
h) means for storing the processed signals;
i) means for displaying the data contained within the processed signals as three or four dimensional spin parameter maps.

The spin parameter maps comprise a series of separate slices through the defined region and since each one of the series is taken at a defined time the series can be used to form a plurality of moving sequences at each planar level thereby allowing any movement of a portion of the spin parameter map from one plane to another to be followed in addition to the movement across a plane.

A number of alternative but related methods of volume imaging are now presented. These rely on selective excitation of a thick slice of the object chosen to enclose the volumar region of interest. The first is echo-volumar imaging (EVI). (NB. the term EVI is also used as a generic expression for all ultra-high speed volumar imaging). This is basically a four shot method. Experimental results are presented for this method and for a low angle variant in which all four separate experiments merge into a contiguous sequence. The fastest method is blipped EVI (BEVI). This is a true one shot or snapshot technique. Both EVI and BEVI may be combined with zonal magnification or 'zooming' (ZEVI) to give improved spatial resolution (Mansfield, Ordidge and Coxon, J. Phys. E Vol. 21, 275–80 1988). Although there are many obvious workable multi-shot variants, we shall concentrate here on a true one-shot technique, ZEVI-1. All variants can be combined with low angle pulses for real-time volumar imaging or 3 D spin parameter mapping.

Embodiments of the present invention will now be described, by way of example with reference to the accompanying drawings in which.

6(a) Image spectrum and image projection.

6(b) Separate images of the 16 planes in 6(a). NB. The flask axis is aligned along the z-axis with the neck to the right in FIG. 6(a) tapering to the tip in image 16 of FIG. 6(b). The selective slice thickness was 90 mm. The pixel resolution in the x,y-plane is 24 mm, which gives rise to a coarse chunky appearance to these images.

Figure 7A:
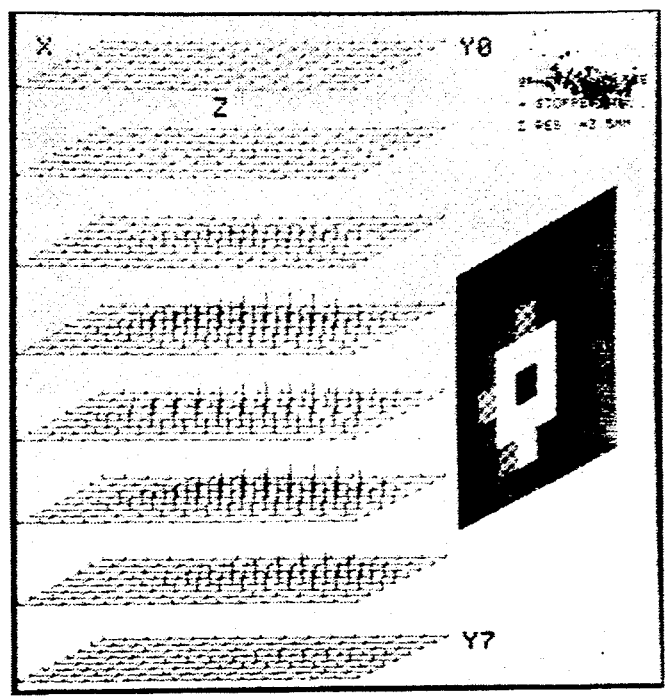
Figure 7B:
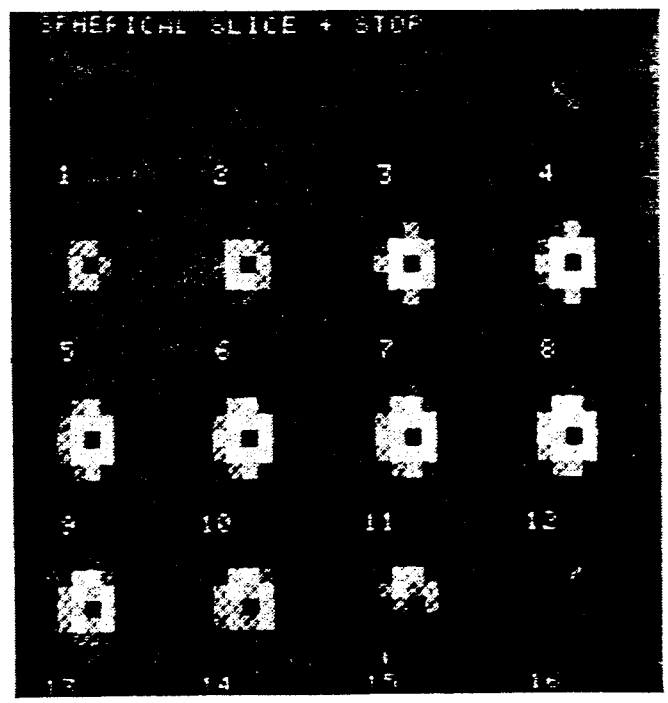

FIGS. 7a and 7b shows a volume image obtained by EVI of a water filled hemispherical phantom with a solid plug (dark central spot).

7(a) Image spectrum and image projection.

Figure 8A:
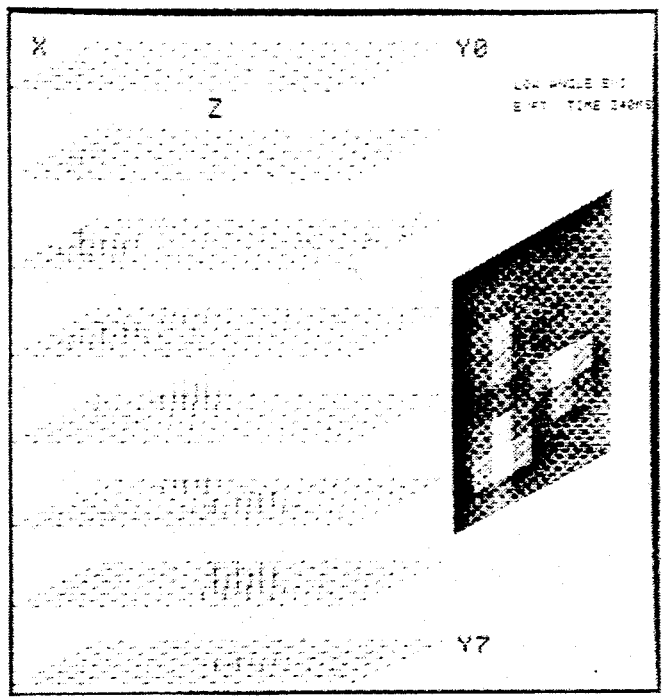
Figure 8B:
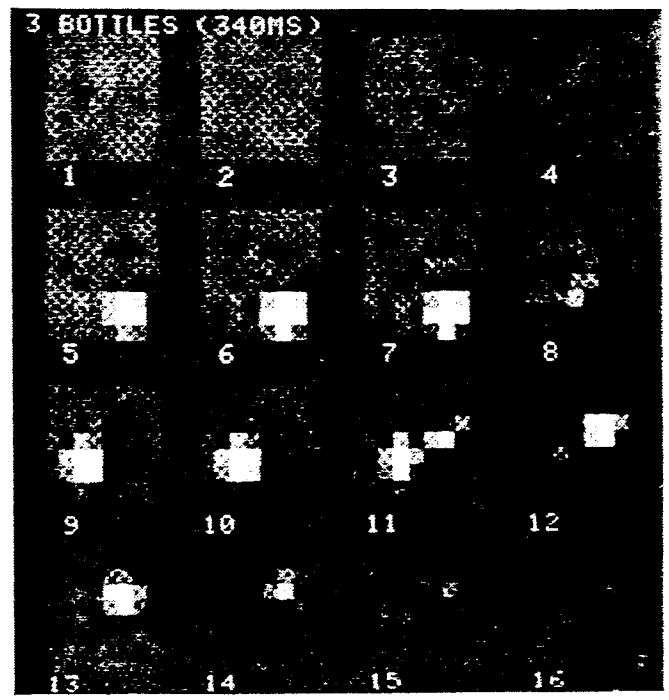

7(b) Separate images of the 16 planes in 7(a). The cylindrical axis lies along the z direction with the flat face to the right in 7(a) corresponding to images 14 and 15 in 7(b). The selective slice thickness was 56 mm;

FIGS. 8a and 8b shows a rapid echo-volumar image of three water filled bottles using low angle excitation pulses. The imaging time was 340 msec and includes three delays each of 66 msec.

8(a) Image spectrum and image projection.

8(b) Separate images of the 16 planes in 8(a), and

Figure 9:
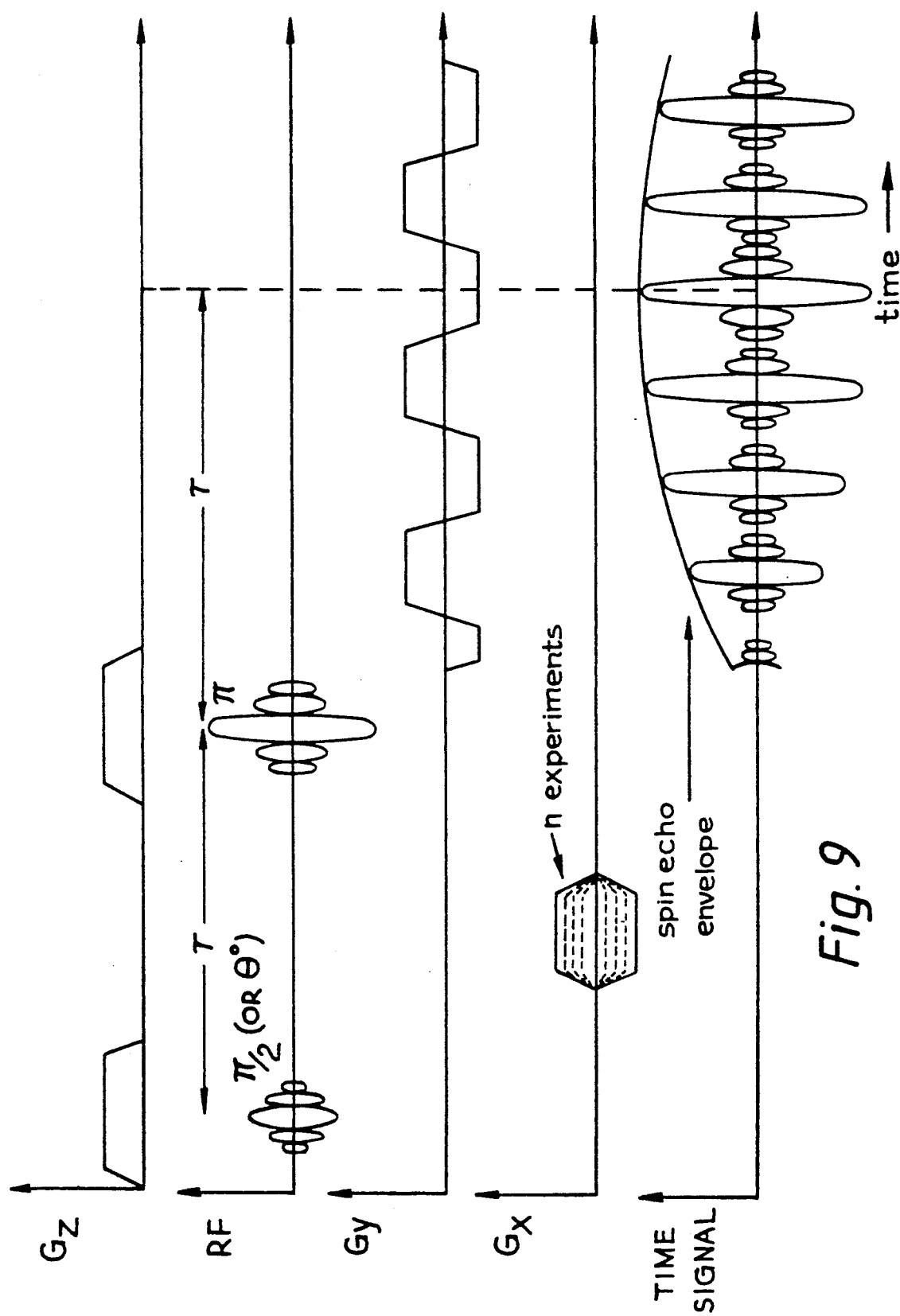

FIG. 9 shows pulse timing diagrams for a three dimensional phase encoded echo planar spatially mapped chemical shift experiment.

THEORY OF EVI (ECHO-VOLUMAR IMAGING)

Figure 1:
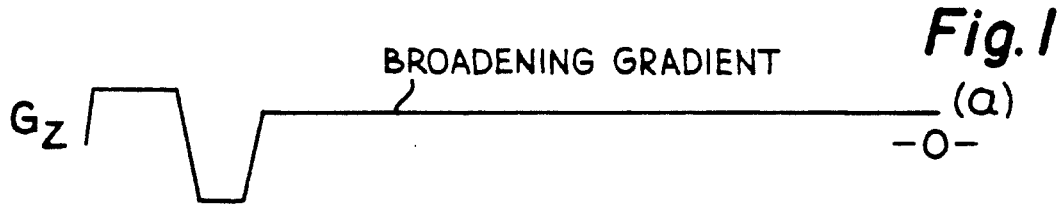
FIGS. 1a, 1b, 1c, 1d, 1e, 1f and 1g shows pulse timing diagrams for EVI (a–e) and the waveform modifications for BEVI (f and g)
Figure 1:
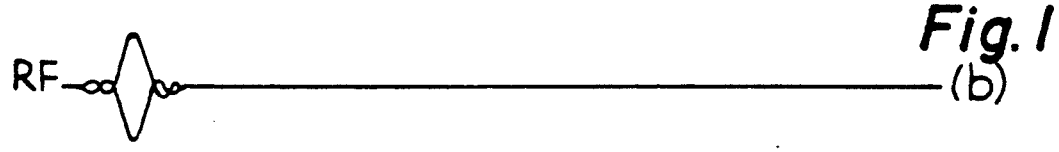
Figure 1:
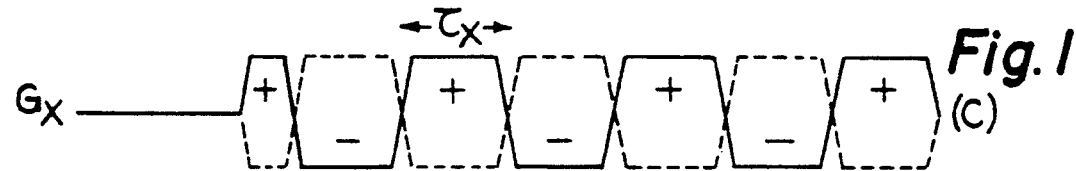
Figure 1:
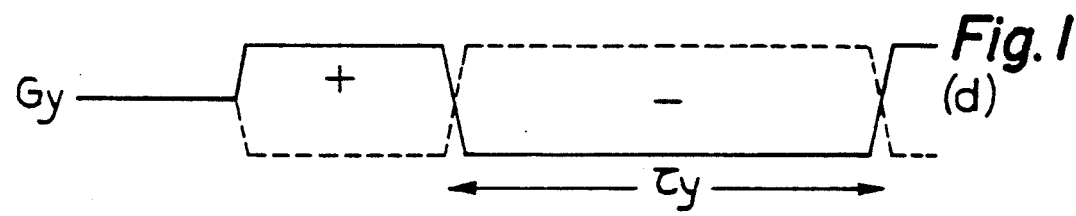
Figure 1:
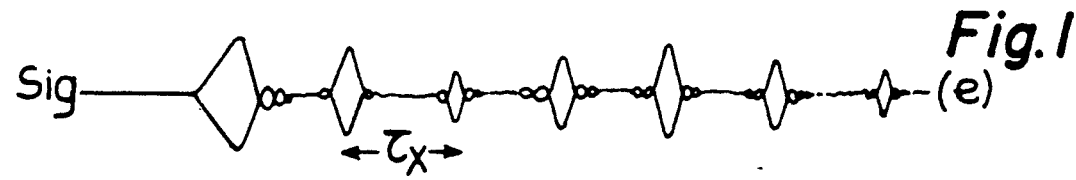
Figure 1:
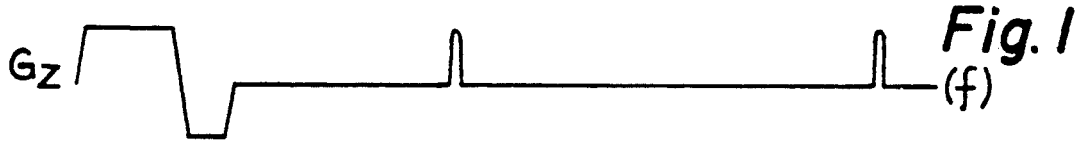
Figure 1:

FIG. 1 shows the pulse timing diagrams for EVI (a-e) and the blipped pulse modifications for BEVI (f and g). FIG. 1(a) shows the initial thick slice selection procedure in $G_z$ together with the selective RF pulse (b), the z-axis broadening gradient (a) and the periodically modulated gradients $G_y$ and $G_x$ (c) and (d). Note that these gradients are ideally of rectangular waveform, however, in practice a trapezoidal waveform may be used together with non-linear sampling of the signal. In this case the x-gradient additionally must be shaped at the y-gradient cross-over regions. For trapezoidal waveforms this takes the form of vee notches in the x-gradient waveform. Other waveforms may be used including cosinusoidal modulation provided non-linear sampling is also used. Also shown in FIG. 1 is the nuclear signal (e) and alternative waveforms for $G_z$ (g) and $G_y$ (f) in which the z-axis broadening and y-axis encoding gradients are applied in the form of short duration blips.

The free induction decay signal S(t) in the rotating reference frame at time t following slice selection, is given by $$S(t) = S(k) = r.p. \int \rho(r) \exp[ik \cdot r] dr \quad (1)$$

where $\rho(r)$ is the spin density within the slice at position r, and k is the reciprocal space wave vector (10, 11) (P. Mansfield & P. K. Grannell J. Phys C6 L422 (1973) and S. Ljunggen J. Mag Res Med 1 370-376 (1984)) given by $$k = \int_0^t \gamma[iG_x(t') + iG_y(t') + kG_z(t')]dt' \quad (2)$$

in which $\gamma$ is the magneto-gyric ratio and $G_x(t')$, $G_y(t')$ and $G_z(t')$ are time dependent linear magnetic field gradients.

Figure 2:
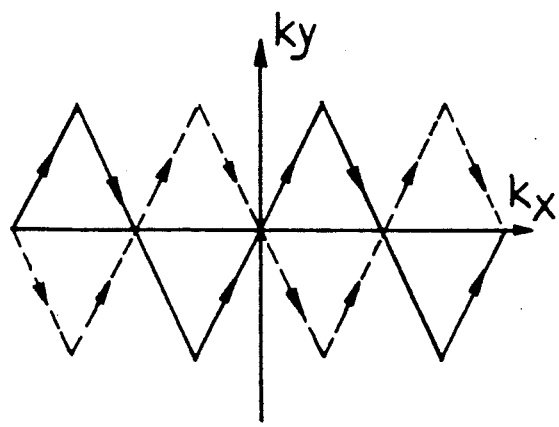
FIGS. 2a and 2b show k-space trajectory projections for EVI with FIG. 1
  2(a) Projection as seen along the $k_z$ axis.
  2(b) Projection as seen along the $k_y$ axis.
  Dotted lines represent alternative trajectories.
Figure 2:
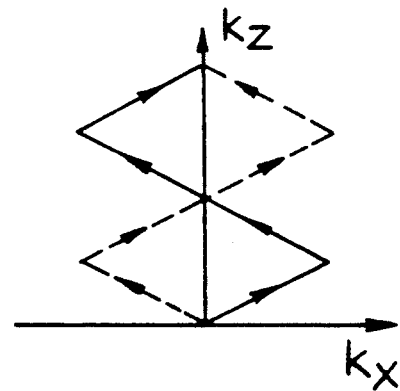

FIG. 2a shows the z-axis projection of the k-space pathway scanned in EVI. FIG. 2b shows the pathway in the x-z plane. In both Figures the dotted lines are alternative pathways which correspond to a change of the starting phase of the appropriate gradient (see FIG. 1). In performing the Fourier transform (FT) of the k-space map it is necessary that the arrows point in the same direction on each projection. This can be achieved by performing four experiments in which all permutations of the starting phases of the x- and y- gradients are used. This gives four different possibilities for the nuclear signal S(t) which we denote as $S^{++}$, $S^{+-}$, $S^{-+}$ and $S^{--}$. All four signals are then edited and spliced to give four edited signals $E^{++}$, $E^{+-}$, $E^{-+}$ and $E^{--}$ which effectively evolve in either a wholly +ve or a −ve y-gradient and in either a wholly +ve or a −ve x-gradient. In this arrangement the z-gradient may be either +ve or −ve for all permutations of the x- and y-gradients. In a straightforward extension of these principles, four dimensional scans may be produced by allowing the z-gradient also to be modulated. We would then have eight permutations of the starting phases of the x-, y- and z-gradients. The fourth dimension so created could be used to map chemical shifts and/or hyperfine interactions.

The echo-planar shift mapping (EPSM) technique, described elsewhere (P. Mansfield, Mag. Res. Med. 1, 370-386 (1984), D. N. Guilfoyle and P. Mansfield, Mag. Res. Med. 2, 479-489 (1985)), is a related three dimensional experiment (x, y and chemical shift) which also uses two modulated gradients in addition to the slice selection gradient.

The above described three dimensional scanning procedure is a four shot process which may be combined into either two two-shot pulse sequences or a single sequence by use of suitable low angle selective RF pulses. In either case the nutation angles of successive pulses must satisfy the recursion relationship P. Mansfield Mag. Res. Med. 1 370-386 (1984).

$$\tan \alpha_n = \sin \alpha_{n+1} \quad (3)$$

where n is integer and where the last pulse always has a nutation angle of 90°. For pairs of pulses the angles are 45° and 90°. For a single experiment using four low angle pulses the angles are 30°, 35.26°, 45° and 90°. The editing and splicing process results in four separate three dimensional images which may be coadded into a single image with a factor 2 improvement in signal-noise ratio.

Blipped EVI

Figure 3:
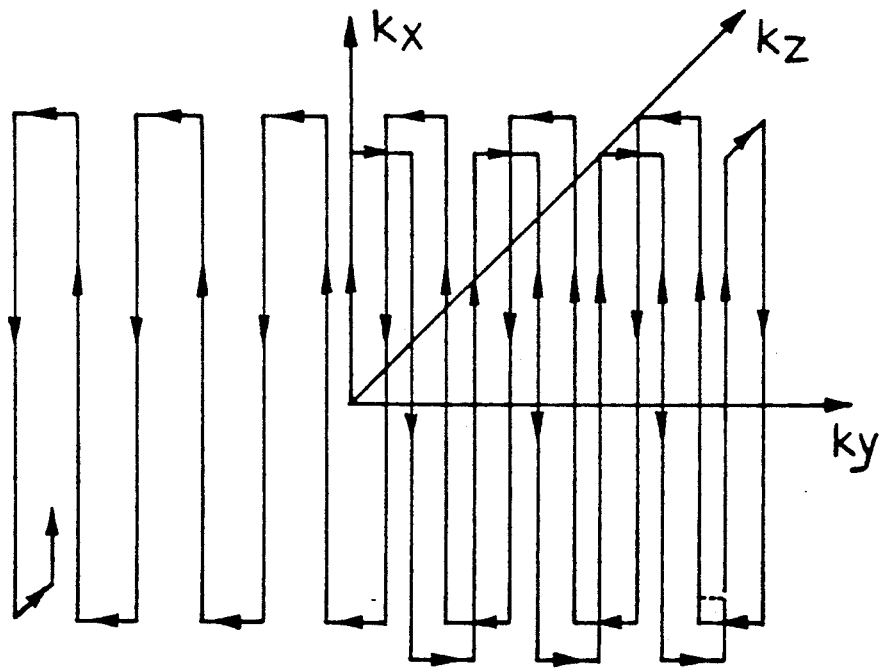
FIG. 3 shows a sketch of part of a three dimensional k-space trajectory for BEVI.

The blipped gradient version also described in FIG. 1 (BEVI) is a true one-shot imaging process in which the signal is recorded after one selective pulse which may have an arbitrary nutation angle $\alpha°$. In this case it is possible to arrange traversal of k-space in one pass as sketched in FIG. 3. To achieve this z- and y-gradient blips are applied together with trapezoidal or other general modulation of the x-gradient such that the y-blips correspond to the zero crossings in $G_x$. The z-blips as sketched are applied less frequently at the effective zero crossings where the phase of the $G_y$ gradient changes sign. The nuclear signal comprises a series of fast spin echoes in $G_x$ modulated by slower echoes in $G_y$. The whole echo train decays away due to the z-gradient broadening blips. Again, however, the arrows for each z-plane should be pointing in the same direction. This is achieved simply by reversing appropriate echoes corresponding to the arrowed portions of k-space in FIG. 3. Just as in EVI there are eight possible experiments corresponding to the various permutations of the signs of the gradients each one of which is capable of producing a full image. Only two cases are illustrated in FIG. 1.

For suitably spliced echo volumar images and also for blipped EVI when there is insignificant signal decay over the duration of an individual echo, it can be shown that for discrete signal sampling, (linear or non-linear depending on whether square-wave gradient modulation or some other general waveform modulation is used), the edited EVI time signals are equivalent to the discrete functions.

$$E^{\pm\pm\pm}(t) = \Sigma\Sigma\Delta x \Delta y \Delta z \rho_{lmn} \cos [l\Delta\omega_x + m\Delta\omega_y + n\Delta\omega_z]t \quad (4)$$

where l, m and n and integers and $\rho_{lmn}$ is the density of the l,m,nth voxel with volume $\Delta x\ \Delta y\ \Delta z$. the superscripts $\pm\pm\pm$ refer to the various combinations of starting phase and/or amplitude sign of the three gradients.

The discrete Fourier transform of equation (4) over a sampling period T yields a stick spectrum with a discrete point spacing of $$\Delta\omega_p = \Delta\omega_z = 2\pi/\tau = \gamma\Delta z G_z \quad (5)$$

a y-stick spacing of $$\Delta\omega_y = 2\pi/\tau_y = \gamma\Delta y G_y \quad (6)$$

and an x-stick spacing of $$\Delta\omega_x = 2\pi/\tau_x = \gamma\Delta x G_x. \quad (7)$$

For non-overlap of spectral components and for fixed overall receiver bandwidth $\Delta\Omega$, we must satisfy the conditions $$\Delta\Omega = L\Delta\omega_x = LM\Delta\omega_y = LMN\Delta\omega_z = P\Delta\omega_p \quad (8)$$

where L,M and N are the largest values of l,m and n which span the object field and where the total number of points describing the image is $$P = LMN. \quad (9)$$

From FIG. 1 and from equations (5)–(8) we may also write $$\tau = P\tau = N\tau_y = NM\tau_x \quad (10)$$

for a complex FT where $\tau$ is the sampling period and the x- and y-gradient echoes are modulo $\tau_x$ and $\tau_y$ respectively P Mansfield, P. K. Grannel J. Phys. C 6 L422 (1973). Furthermore, for equal resolution the gradient strengths are given by $$G_y = NG_z \quad (11)$$

and $$G_x = MG_y = NMG_z \quad (12)$$

An alternative to BEVI which places lower demands on the gradient coil switching capability is the single shot EVI (SEVI) method. This creates an image by performing one EVI experiment and processing the data by re-ordering planes and reversing lines within planes as in BEVI. The distribution of data points in reciprocal space is not uniform in this case, but a software correction may be used to compensate for this.

Zoomed EVI (ZEVI)

There are several possibilities for producing zonally magnified (zoomed) echo-volumar images which combine the present work with that of zoomed echo-planar imaging, (ZEPI), (Mansfield, ordidge and Coxon J. Phys. E Vol. 21 275-80 1988). Most of these possibilities, however, are multi-shot methods. The greatest potential of ZEVI is for localised volume studies in the heart. For this reason we concentrate on a one shot zoom technique ZEVI-1.

Figure 4:
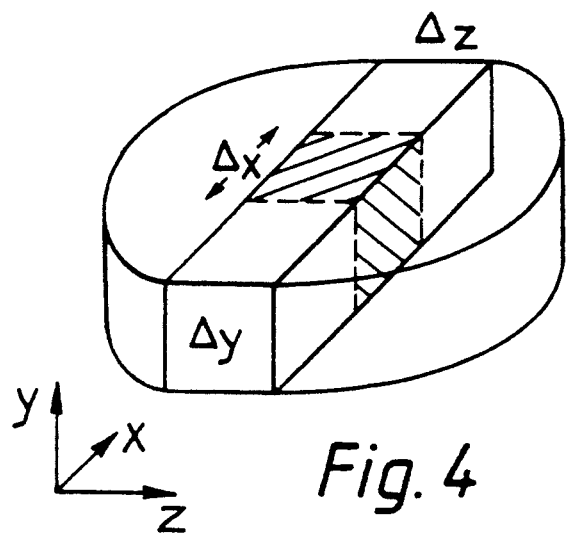
FIG. 4 shows a sketch showing zonal volume definition (shaded) for ZEVI.

The volume of interest is defined along two axes, z and y, by use of selective pulses and appropriate gradients, FIG. 4. The extent along the x-axis is defined by the receiver bandwidth $\Delta\Omega$. Equation (8) together with Equations (5–7) determine the resolution and volume array size.

Figure 5:
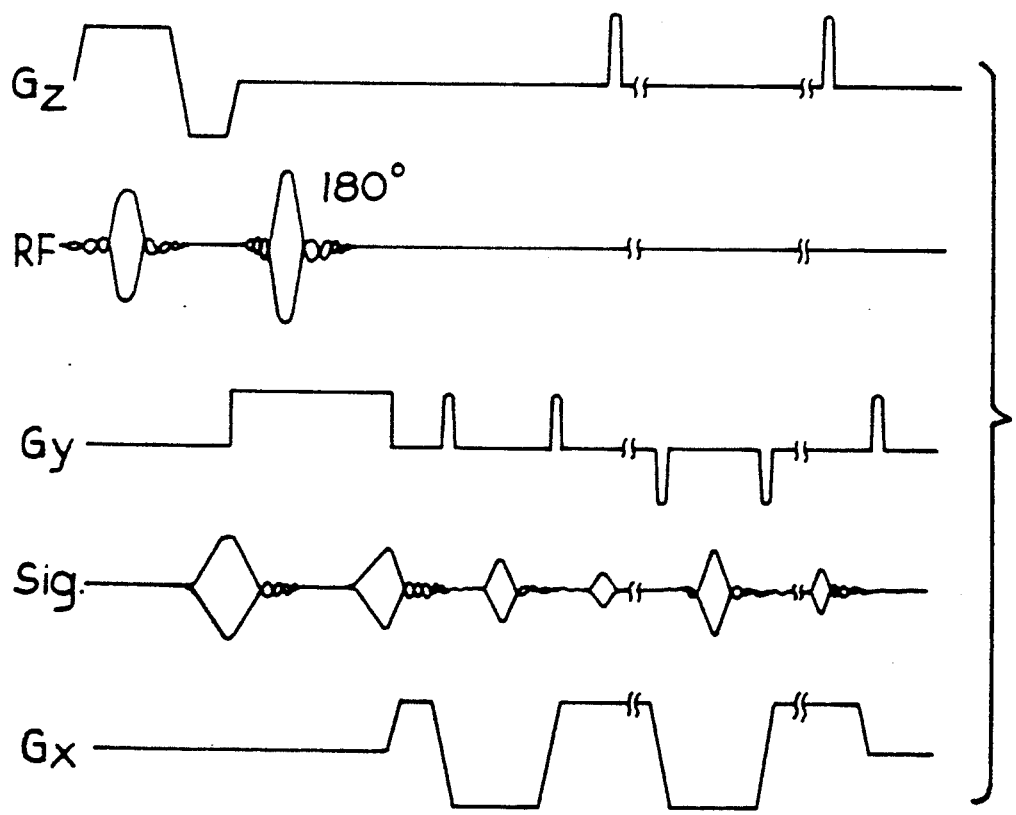
FIG. 5 shows a timing diagram and pulse sequence for ZEVI-1.

The detailed pulse timing diagrams for ZEVI-1 are shown in FIG. 5. An initial thick slice is excited in $G_z$ with a selective RF pulse having a nutation angle $\alpha°$. With $G_z$ off and $G_y$ switched on a selective 180° pulse is applied which refocuses the spins in the desired column. At this point a modulated x-gradient is applied together with z- and y-gradient blips.

The single free induction decay sequence must be appropriately reordered. This is done by reversing the time data on alternate fast echoes and on alternate slow echoes. When this is done a single Fourier transform may be used to produce the image array. For the data reordering to work well, we require the snapshot imaging time to be less than the spin-spin relaxation time $T_2$.

Design Example

Let the selected volume be cubic with a side of 100 mm. Let L=M=20 and N=10 making an array of $20 \times 20 \times 10$ voxels. This comprises 10 planes each of thickness 10 mm with an in-plane resolution of 5 mm. Take the imaging time T=64 ms giving a frequency per point, Equation (5), of 16 Hz. In EVI the required x-gradient is 1.52 G/cm. The y- and z-gradients are 75 mG/cm and 3.8 mG/cm respectively. In this example $\Delta\Omega = 64$ kHz. When $G_y$ and $G_z$ are applied in the form of short blips of duration $t_B$ as in BEVI, their amplitudes become approximately, $G_y \approx 76(\tau_y/t_B)$mG/cm and $G_x \approx 1.52(\tau_x/t_B)$G/cm.

Experimental EVI Results

Some preliminary experimental results have been obtained using the elementary EVI 4 shot sequence as a vehicle to test the principles. In these experiments the object field was $192 \times 192$ mm². The total number of points describing the image data array, P=1024 with L=M=8 and N=16. That is to say the three dimensional image consists of 16 planes each comprising an $8 \times 8$ image array. The in-plane pixel resolution is therefore 24 mm giving rather coarse images in the x, y-plane. The resolution along the z-axis depends on the thickness of the initially excited selective slice. This varies in the examples given.

The timing parameters used were: T=32 ms, $T_y$=2.0 ms and $T_x$=0.25 ms. The waveforms were approximately rectangular (trapezoidal) so that linear signal sampling was used. The x-gradient modulation frequency was 4.0 kHz. At this relatively high frequency it is probably better to use sinusoidal modulation together with non-linear sampling, especially with a larger object field. However, this strategy is more easily accomplished in BEVI.

Figure 6A:
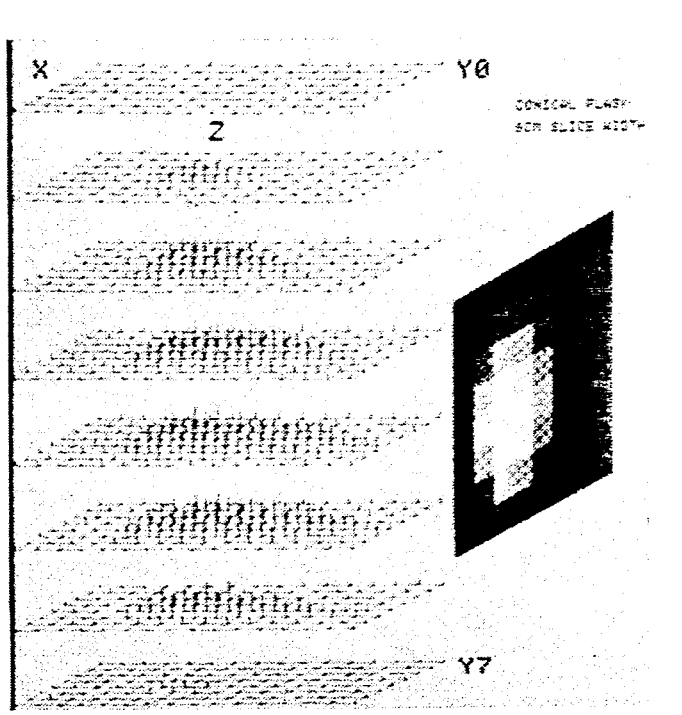
FIGS. 6a and 6b shows a volume image of a water filled conical flask obtained by EVI.
Figure 6B:
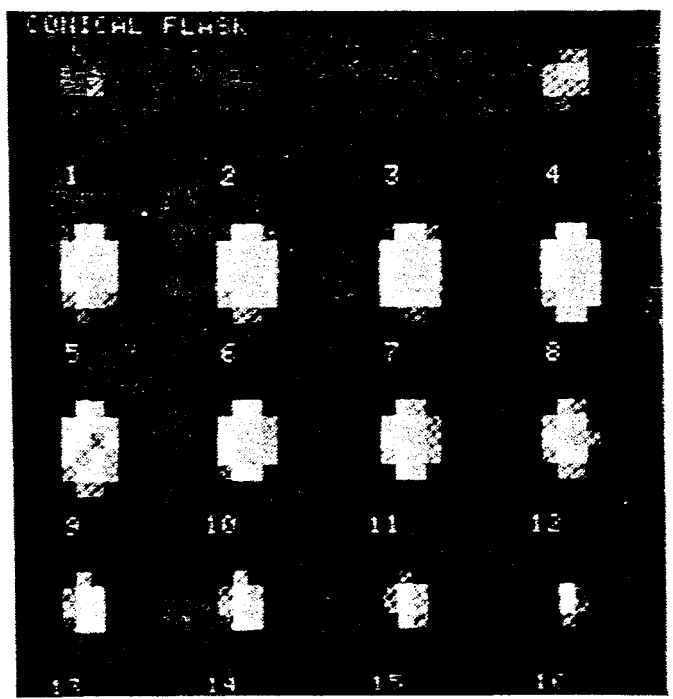

FIG. 6a shows the three dimensional spectrum corresponding to a water filled conical flask with its cylindrical axis aligned along the z direction. Each grid layer corresponds to one of 8 y-planes labelled (Y0-Y7). The x- and z-axes have 8 and 16 divisions respectively. Also inset on this Figure is the image projection along the z-axis. FIG. 6b shows the individual images in every z-plane. The initial slice thickness was 90 mm. The complete volume image was obtained in 4 s.

Another example of an EVI spectrum is shown in FIG. 7a. The object here is a hemispherical water phantom containing a cylindrical plug of solid material. The cylindrical axis of the hemisphere is along the z-direction. The flat surface of the object lies approximately in the z-plane at level 15. The initial slice thickness was 56 mm. This volume image took 4 s to produce.

FIG. 8a and 8b are echo-volumar images of a water filled phantom consisting of three short bottles resolved in the x, y plane and displaced along the z-axis. The results were obtained in four shots using a low angle selective pulse. The total imaging time was 340 ms.

Conclusion

By suitable introduction of spatial encoding along a third axis it is possible to perform rapid volume imaging. One form of this, EVI, is a four shot technique requiring four separate experiments before an image can be unambiguously extricated from the data. The time to produce an image by this means depends on the delay between shots. By using low angle pulses we have been able to take all four shots in 340 ms, though it is possible to take even shorter times.

An alternative volume imaging method, BEVI, uses gradient blips to spatially encode along the y- and z-axes. This is a true snapshot volumar imaging technique which takes between 32-64 ms to perform. The rather large gradients required, combined with a very wide receiver bandwidth, mean that neither EVI nor BEVI are likely to find application in high resolution medical imaging. however a further alternative which overcomes the bandwidth problem but still requires substantial gradients is ZEVI. In this method a small volume is selectively excited within the subject and a three dimensional image formed. The third axis of the required volume is defined by the receiver bandwidth. The ZEVI-1 technique is a snapshot process and operates at fixed receiver bandwidth. Depending on gradient strengths available, the method can be used to zoom into smaller and smaller volumes with fixed array size. Using a combination of selective pulses and extra sampling and bandwidth, the selected volume can be steered throughout the larger volume of the subject so as to interrogate the spin system as required. ZEVI-1 could therefore find application in cardiac and other types of medical imaging.

As a variation to the proposed volumar imaging technique, a rapid multishot sequence can be performed by applying a modulated y gradient and a blipped x gradient in each sequence, with phase encoding using an incremented (or decremented) z gradient in successive experiments to form the thrid image direction. The RF excitation pulse can either be non-selective or select a broad slice for 3D imaging of a thick slab of material. The experiments may be applied in rapid succession if the RF pulse causes a low nutation angle 10°-45° typically), and 3D imaging may thus be achieved in an experiment lasting a few seconds.

The x gradient blips may be preceded by a large negative x gradient pulse to cause an effective spin echo in x gradient evolution midway through the experiment. The time data may then be treated with a magnitude Fourier transform to avoid distortion of the image through phase non-uniformity.

A further variation of volumar or three dimensional imaging is when the thrid dimension represents a parameter other than the spatial dimension, for example, when the third axis represents chemical shift. A small modification of the pulse timing diagram of FIG. 5 yields FIG. 9. Here the two image axes are encoded by the x-and y-gradients. As sketched, $G_y$ is modulated with a trapezoidal wave form following slice selection using a selective 90° RF pulse and 180° refocusing pulse at time $\tau$ later. Without Gx the Fourier transform of the echo train produces a discrete spin projection of the object in the y-gradient, which we refer to as a stick spectrum. Because of the 180° pulse, the echo-train produces its peak signal a further time $\tau$ after. This enables use of a power Fourier transformation or modulus Fourier transformation to be performed with its consequent independence of signal phase errors.

Chemical shift differences present in the spin species will shift the sticks. These may be regrouped to form a "streak map" or y-$\delta$ plot of the data as described in P. Mansfield, Magnetic Resonance in Medicine 1, 370–386 (1984). By phase encoding the signal with x-gradient blips as indicated, each streak is modulated by the pahse encoding gradient. The streak signal variations may be further Fourier transformed along a third x-axis to yield separate images for each chemically shifted species. By this means we produce a three dimensional array.

As presently described, the phase encoding blips of x-gradient are applied in the form of n incremented steps, one for each successive experiment. This means that n separate experiments must be performed before reconstruction of the three dimensional array can start. When the phase encoding blips are applied appropriately during one experiment, the pulse sequence reduces to the echo-planar shift mapping (EPSM) experiment described in U.K. Patent No. GB 2 128 339B.

With reference now to FIG. 9, the selective RF pulses may be replaced by non-selective pulses and an additional spatial dimension may be introduced by an outer cycle of z gradient phase encoding. The data matrix is then four dimensional and may be reconstructed by Fourier transformation in four dimensions.

All of the experimental techniques may be applied in a manner which creates either decaying free induction decays (FID's) or spin echo trains which can be Fourier transformed to produce phased data, or spin echo FID's or spin echo trains which can be Fourier transformed to produce magnitude data. The spin echo FID's or echo trains can be produced by using gradient pulses prior to data acquisition where spatial information is involved, or by using 180° pulses and time intervals when chemical shift evolution is involved.

We claim:

1. A nuclear magnetic resonance (NMR) method of producing a series of three or four dimensional spin parameter maps of a defined region of a generally stationary object, which spin parameter maps are displayable as a set of contiguous planar spin parameter maps with a first orientation within the defined region, the method for producing such spin parameter maps comprising the steps of:

subjecting the object to:

a) a static magnetic field,
b) selective shaped RF pulses for regional localised spin excitations, and
c) non-selective RF pulses, applying a plurality of first linear magnetic field gradients at least one of which is modulated in a predetermined and periodic manner and all of which are switched in a controlled manner;

detecting the nuclear magnetic resonance signal produced in the presence of the linear magnetic field gradients;

sampling and digitising the nuclear magnetic resonance signal;

subsequently processing the sampled and digitised signals;

storing the processed signals, and displaying the data contained within the processed signals as the three or four dimensional spin parameter maps.

2. An NMR method of producing a series of three or four dimensional spin parameter maps as claimed in claim 1 in which a first one of the field gradients is a gradient from the group consisting of trapezoidal, sinusoidal or co-sinusoidal.

3. An NMR method of producing a series of three or four dimensional spin parameter maps as claimed in claim 2 in which the field gradients are switched using switching from the group consisting of simultaneously switching and sequentially switching.

4. An NMR method of producing a series of three or four dimensional spin parameter maps as claimed in claim 3 in which a second one of the gradient waveforms is pulsed in blips.

5. An NMR method of producing a series of three or four dimensional spin parameter maps as claimed in claim 3 in which a second gradient waveform is of constant value.

6. An NMR method of producing a series of three or four dimensional spin parameter maps as claimed in claim 3 in which a second gradient waveform is periodically modulated.

7. An NMR method of producing a series of three or four dimensional spin parameter maps as claimed in claim 1 in which a second gradient forms part of a slice selection process and which is in addition at a different time periodically modulated.

8. An NMR method of producing a series of three or four dimensional spin parameter maps as claimed in claim 1 in which a second gradient forms part of a slice selection process and in addition at a different time is pulsed in short duration blips.

9. An NMR method of producing a series of three or four dimensional spin parameter maps as claimed in claim 1 in which a second gradient forms part of a slice selection process together with the application of a shaped RF pulse which nutates NMR spins within a defined region and in addition at a different time the second gradient is switched on in a continuous manner to provide spatial encoding along a second gradient axis.

10. A nuclear magnetic resonance (NMR) method of producing in a single shot experiment a spin parameter map of arbitrary orientation of a region of an object comprising the steps of:
selecting a thick slice through the object;
obtaining and storing NMR signals from a plurality of planes within the thick slice of the object;
selecting from the stored signals those required to provide information relating to the selected arbitrary oriented map; and
displaying the map.

11. A nuclear magnetic resonance (NMR) method of producing in a single shot experiment a series of three or four dimensional spin parameter maps of a defined region of a generally stationary object, wherein the defined region comprises a thick slice through said object, comprising the steps of:
using a magnetic field gradient means to select the desired thick slice region of said object,
obtaining NMR signals from a plurality of M parallel planes within the thick slice of the object,
storing the NMR signals for a total number of said M parallel planes within the thick slice of the object, and
selecting from the stored NMR signals predetermined NMR signals from a number N, where $N \leq M$, of the parallel planes to form a spin parameter map of arbitrary orientation within the thick slice.

12. An NMR method of producing in a two shot experiment a spin parameter map of arbitrary orientation of a region of an object comprising the steps of:
selecting a thick slice through the object;
obtaining and storing NMR signals from a plurality of planes within the thick slice of the object;
selecting from the stored signals those required to provide information relating to the selected arbitrary oriented map; and
displaying the map.

13. A nuclear magnetic resonance (NMR) method for producing in a two shot experiment a series of three or four dimensional spin parameter maps of a defined region of a generally stationary object, in which the defined region comprises a thick slice through said object, comprising the steps of:
selecting the desired thick slice region of said object by magnetic field gradient means,
obtaining NMR signals from a plurality of M parallel planes within the desired thick slice region of the object,
storing the NMR signals for the total number M of parallel planes within the thick slice of the object, and
selecting from the stored NMR signals, predetermined NMR signals from a number N, where $N \leq M$, of the parallel planes to form a spin parameter map of arbitrary orientation within the thick slice.

14. An NMR method of producing in a four shot experiment a spin parameter map of arbitrary orientation of a region of an object comprising the steps of:
selecting a thick slice through the object;
obtaining and storing NMR signals from a plurality of planes within the thick slice of the object;
selecting from the stored signals those required to provide information relating to the selected arbitrary oriented map; and
displaying the map.

15. A nuclear magnetic resonance (NMR) method of producing in a four shot experiment a series of three or four dimensional spin parameter maps of a defined region of a generally stationary object, in which the defined region comprises a thick slice through said object, comprising the steps of:
selecting the desired thick slice region of said object by magnetic field gradient means, obtaining NMR signals from a plurality of M parallel planes within the desired thick slice region of the object, storing the NMR signals for a total number M of parallel planes within the thick slice of the object, selecting from the stored NMR signals predetermined NMR signals from a number N, where $N \leq M$, of the parallel planes to form a spin parameter map of arbitrary orientation within the thick slice.

16. An NMR method of producing in not more than four experiments a spin parameter map of arbitrary orientation of a region of an object comprising the steps of:

selecting a thick slice through the object;

obtaining and storing NMR signals from a plurality of planes within the thick slice of the object;

selecting from the stored signals those required to provide information relating to the selected arbitrary oriented map; and displaying the map.

17. A nuclear magnetic resonance (NMR) method of producing in not more than four experiments a series of three or four dimensional spin parameter maps of a defined region of a generally stationary object, in which the defined region comprises a thick slice through said object, comprising the steps of:

selecting the desired thick slice region of said object by magnetic field gradient means, obtaining NMR signals from a plurality of M parallel planes within the desired thick slice region of the object, storing the NMR signals for the total number M of parallel planes within the thick slice of the object, selecting from the stored NMR signals predetermined NMR signals from a number N, where $N < M$, of the parallel planes to form a spin parameter map of arbitrary orientation within the thick slice.

18. An NMR method of producing a spin parameter map of arbitrary orientation of a region of an object comprising the steps of:

selecting a thick slice through the object by subjecting the object to a z-axis slice selection and broadening gradient;

obtaining and storing NMR signals from a plurality of planes within the thick slice of the object;

selecting from the stored signals those required to provide information relating to the selected arbitrary oriented map; and displaying the map.

19. A nuclear magnetic resonance (NMR) method of producing a series of three or four dimensional spin parameter maps of a defined region of a generally stationary object, in which the defined region comprises a thick slice through said object, by subjecting the object to a z-axis slice selection and broadening gradient, comprising the steps of:

selecting the desired thick slice region of said object by magnetic field gradient means, obtaining and storing NMR signals from a plurality of M planes within the thick slice of the object, storing the NMR signals for the total number M of parallel planes within the thick slice of the object; and selecting from the stored NMR signals predetermined NMR signals from a number N, where $N < M$, of the parallel planes to form a spin parameter map of arbitrary orientation within the thick slice.

20. A nuclear magnetic resonance (NMR) method of producing a series of three or four dimensional spin parameter maps of a defined region of a generally stationary object in which the defined region comprises a rectanguloid of dimensions $\Delta X$, $\Delta Y$ and $\Delta Z$ measured in mutually orthogonal axes X, Y and Z, comprising the steps of selecting a desired thick slice region of the object (by magnetic field gradient means) the thickness of the slice being $\Delta Y$, defining by selective pulses and gradients the defined region of dimensions $\Delta X$, $\Delta Y$ and $\Delta Z$, obtaining NMR signals from a plurality of M parallel planes within the defined region of dimensions $\Delta X$, $\Delta Y$ and $\Delta Z$ of the object, storing the NMR signals for the total number M of parallel planes within the defined region of dimensions $\Delta X$, $\Delta Y$ and $\Delta Z$ within the object, selecting from the stored NMR signals predetermined NMR signals from a number N (where $N \leq M$) of the parallel planes to form a spin parameter map of arbitrary orientation.

21. An NMR method as claimed in claim 20 in which the dimension $\Delta X$, is determined by the bandwidth of a receiver connected to receive the NMR signals from the M parallel planes.

22. An NMR method as claimed in claim 12 in which the rectanguloid is a cube, $\Delta X$, $\Delta Y$ and $\Delta Z$ being equal.

* * * * *